(12) United States Patent
Zohni et al.

(10) Patent No.: US 8,228,682 B1
(45) Date of Patent: Jul. 24, 2012

(54) ELECTRONIC ASSEMBLY WITH TRENCHES FOR UNDERFILL MATERIAL

(75) Inventors: Nael Zohni, Campbell, CA (US); Thomas B. Templeton, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 179 days.

(21) Appl. No.: 12/860,826

(22) Filed: Aug. 20, 2010

(51) Int. Cl.
*H05K 7/00* (2006.01)
*H01L 23/48* (2006.01)

(52) U.S. Cl. ........ 361/782; 361/760; 361/783; 257/734; 257/737

(58) Field of Classification Search .................. None
See application file for complete search history.

(56) References Cited

U.S. PATENT DOCUMENTS

| | | | |
|---|---|---|---|
| 5,218,234 A * | 6/1993 | Thompson et al. ........... 257/787 |
| 5,710,071 A | 1/1998 | Beddingfield et al. | |
| 6,239,484 B1 | 5/2001 | Dore et al. | |
| 6,391,682 B1 | 5/2002 | Tsai et al. | |
| 6,498,054 B1 | 12/2002 | Chiu et al. | |
| 6,723,584 B2 * | 4/2004 | Kovac et al. .................. 438/118 |
| 6,774,497 B1 | 8/2004 | Qi et al. | |
| 7,473,585 B2 | 1/2009 | Brandenburg et al. | |
| 7,564,140 B2 * | 7/2009 | Lee et al. ....................... 257/783 |
| 7,700,407 B2 * | 4/2010 | Pendse .......................... 438/107 |
| 7,703,199 B2 * | 4/2010 | Caletka et al. .................. 29/840 |
| 8,143,096 B2 * | 3/2012 | Park et al. ..................... 438/107 |
| 2008/0277802 A1 * | 11/2008 | Tsai et al. ...................... 257/778 |
| 2009/0057867 A1 | 3/2009 | Hool | |

* cited by examiner

*Primary Examiner* — Boris Chervinsky
(74) *Attorney, Agent, or Firm* — LeRoy D. Maunu

(57) ABSTRACT

An electronic assembly includes a substrate having bond pads on a surface of the substrate. A solder mask covers the surface of the substrate, and a solder connection is disposed on each of the bond pads. At least one trench is formed in the solder mask, and is located between adjacent ones of the bond pads. At least one component has contact pads, and each contact pad is connected to one of the bond pads via one of the solder connections. The trench is located beneath the device and extends at least from one edge of the device to a location underneath the device. Underfill material fills the trench and space between the solder mask and the device.

20 Claims, 6 Drawing Sheets

ELECTRONIC ASSEMBLY WITH TRENCHES FOR UNDERFILL MATERIAL

FIELD OF THE INVENTION

An embodiment of the present invention generally relates to printed circuit board assemblies, and more particularly, to providing trenches in a solder mask layer for allowing underfill material to flow under electronic components.

BACKGROUND

In assemblies including passive components, such as chip capacitors, on printed circuit boards or other substrates, a gap may remain between the components and the substrate. If the gap is not underfilled, the component and substrate may suffer from fatigue cracking and electrical failure when the entire structure is subjected to high-temperature conditions. To address this problem, an underfill material, such as a type of resin, is applied between the surface of the component and the substrate to fill the gap and thereby provide structural reinforcement. As the size of components continues to decrease, it is becoming increasingly difficult to apply the underfill material to fill the gaps between the chips and the substrate.

An embodiment of the present invention may address one or more of the above issues.

SUMMARY

In one embodiment of the present invention, an electronic assembly includes a substrate having bond pads on a surface of the substrate. A solder mask covers the surface of the substrate, and solder connections are formed on the bond pads. At least one trench is formed in the solder mask, and the trench is located between adjacent ones of the bond pads. At least one component has contact pads, and each contact pad is connected to one of the bond pads via one of the solder connections. The trench is located beneath the component and extends at least from one edge of the component to a location underneath the component. Underfill material fills the trench and space between the solder mask and the component.

A method of manufacturing an electronic assembly is provided in another embodiment. The method includes providing a substrate having bond pads on a surface of the substrate. A solder mask covers the surface of the substrate, and a solder connection is formed on each of the bond pads. At least one trench is formed in the solder mask, and the trench is located between adjacent ones of the bond pads. At least one component is mounted on the substrate. The component has contact pads, and each is connected to one of the bond pads via one of the solder connections. The component is located above the trench, and the trench extends at least from one edge of the component to another edge of the component. Underfill material is dispensed into the trench to fill space between the solder mask and the component.

In another embodiment of the present invention, an electronic assembly includes a substrate having at least two bond pads on a first surface of the substrate; a solder mask on the first surface of the substrate, where the solder mask has at least one trench formed therein and extending between the at least two bond pads; a chip capacitor having at least two contact pads that are soldered to the at least two bond pads, respectively; and underfill material filling the at least one trench and a void between the solder mask and the component.

It will be appreciated that various other embodiments are set forth in the Detailed Description and Claims which follow.

BRIEF DESCRIPTION OF THE DRAWINGS

Various aspects and advantages of one or more embodiments of the invention will become apparent upon review of the following detailed description and upon reference to the drawings in which.

DETAILED DESCRIPTION OF THE DRAWINGS

The one or more embodiments of the present invention provide an electronic assembly that includes a component that is bonded to a substrate. A solder mask layer covers the surface of the substrate and at least one trench is formed in the solder mask layer. The device is mounted on the substrate above the trench and the trench enables underfill material to be dispensed beneath the device to fill the space between the device and the solder mask layer. The trench allows the underfill material to more easily flow under the device and fill the space.

Figure 1:
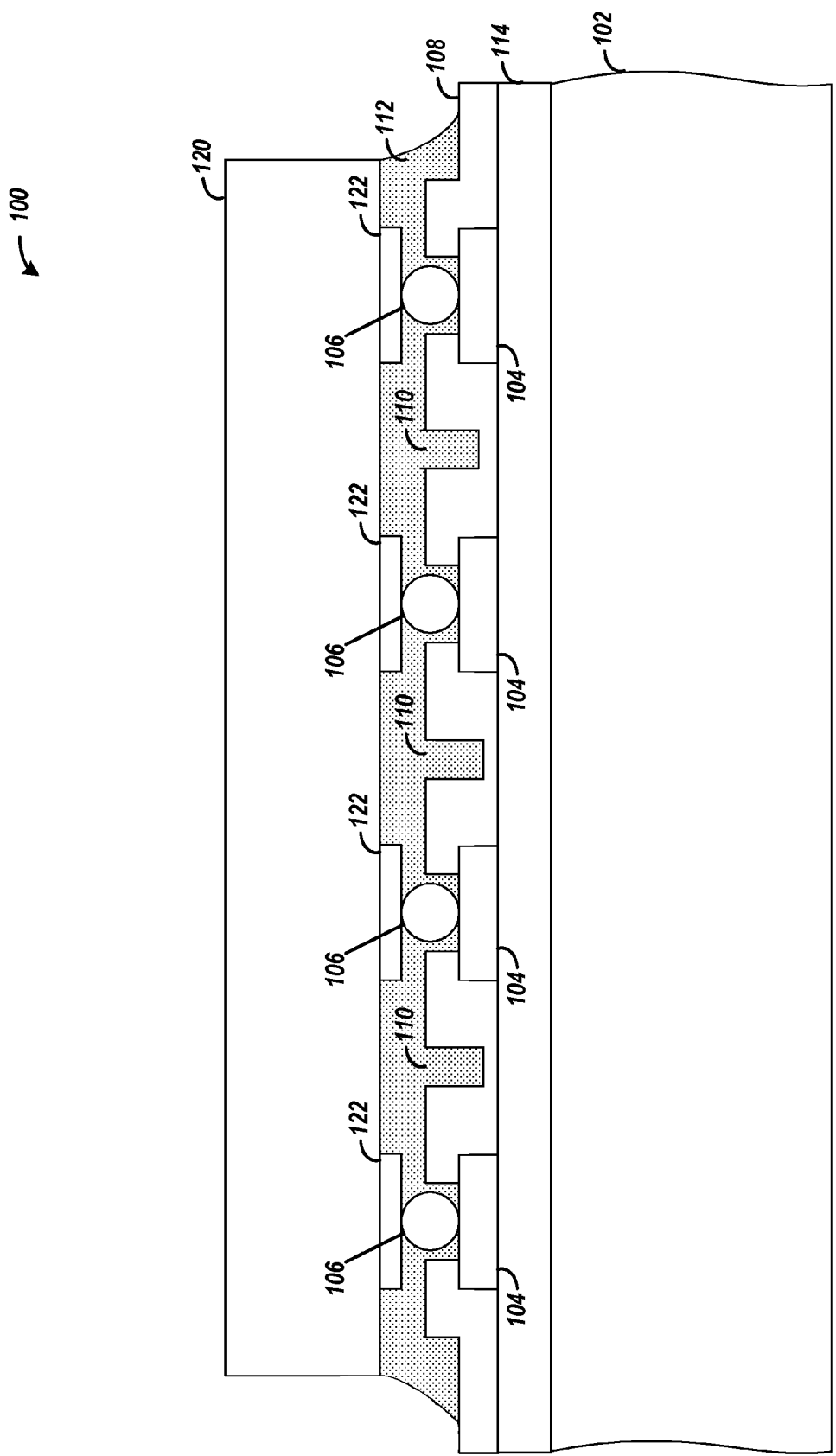
FIG. 1 shows a cross sectional view of an electronic assembly, according to an example embodiment of the present invention.

FIG. 1 is a cross sectional view of an electronic assembly 100, according to an example embodiment of the present invention. The electronic assembly 100 includes a substrate 102 and a component 120 bonded to the substrate 102. Bond pads 104 are located on a first surface of the substrate 102 and the bond pads 104 each have a solder connection 106. The component 120 has contact pads 122 that are each bonded to one of the bond pads 104 via a respective one of the solder connections 106. The solder connections 106 electrically connect the contact pads 122 of the component 120 to the bond pads 104 of the substrate 102. The component 120 is mounted on the substrate 102 using any one of a variety of techniques such as a thermal compression bonding process.

The electronic assembly 100 includes a solder mask layer 108 that is located on the first surface of the substrate 102. In one implementation, the solder mask layer 108 covers portions of the bond pads 104 as shown in FIG. 1. In another implementation, the solder mask layer 108 does not cover portions of the bond pads 104. Trenches 110 are formed in the solder mask layer 108 prior to the component 120 being mounted on the substrate. The trenches 110 are located between adjacent ones of the bond pads 104. In one embodiment, the trenches 110 extend at least from one edge of the component 120 to another edge of the component 120. The electronic assembly 100 also includes a layer of dispensed underfill material 112, which fills the trenches 110 and the space between the component 120 and the solder mask layer 108. The trenches 110 enable the underfill material 112 to readily flow underneath the component 120 and fill the space between component 120 and the solder mask layer 108. The trenches 110 provide channels with increased clearance between the component 120 and the solder mask layer 108 and allow the underfill material 112 to flow completely under the component 120 thereby mitigating the formation of micro-voids. In one implementation, the gap between the component 120 and the solder mask layer 108 is approximately 10 μm and the trenches 110 have a depth of approximately 20 μm.

In one embodiment, components 120 are mounted on the substrate 102. At least one of the trenches 110 is located beneath each of the components 120. In a specific implementation, two adjacent components on the substrate 102 are aligned along the same axis and one of the trenches extends underneath both of the adjacent components.

The electronic assembly 100 further includes a build-up layer 114 that is located between the substrate 102 and the solder mask layer 108. The build-up layer 114 includes dielectric layers and conductive traces that provide electrical connections to the bond pads 104. In one embodiment, the solder mask layer 108 has a thickness of approximately 20 μm and the build-up layer 114 has a thickness of approximately 30 μm.

In one embodiment, the component 120 is a passive component such as a chip capacitor. Chip capacitors can be mounted on the substrate 102, which can be a printed circuit board. At least one of the trenches 110 is located beneath each of the chip capacitors that are mounted on the substrate 102. The trenches 110 are used to dispense underfill material underneath each of the chip capacitors to fill the gaps between the chip capacitors and the solder mask layer 108. The underfill material is dispensed on a per chip capacitor basis. For example, the underfill material is injected into the at least one trench beneath one of the chip capacitors to fill the gap between that chip capacitor and the solder mask layer 108, and then the process is repeated until the underfill material has been dispensed under each of the chip capacitors. An overcoat material may be dispensed to encapsulate the chip capacitor. The overcoat material is dispensed such that each of the chip capacitors on the substrate 102 is separately encapsulated with the overcoat material.

Figure 2:
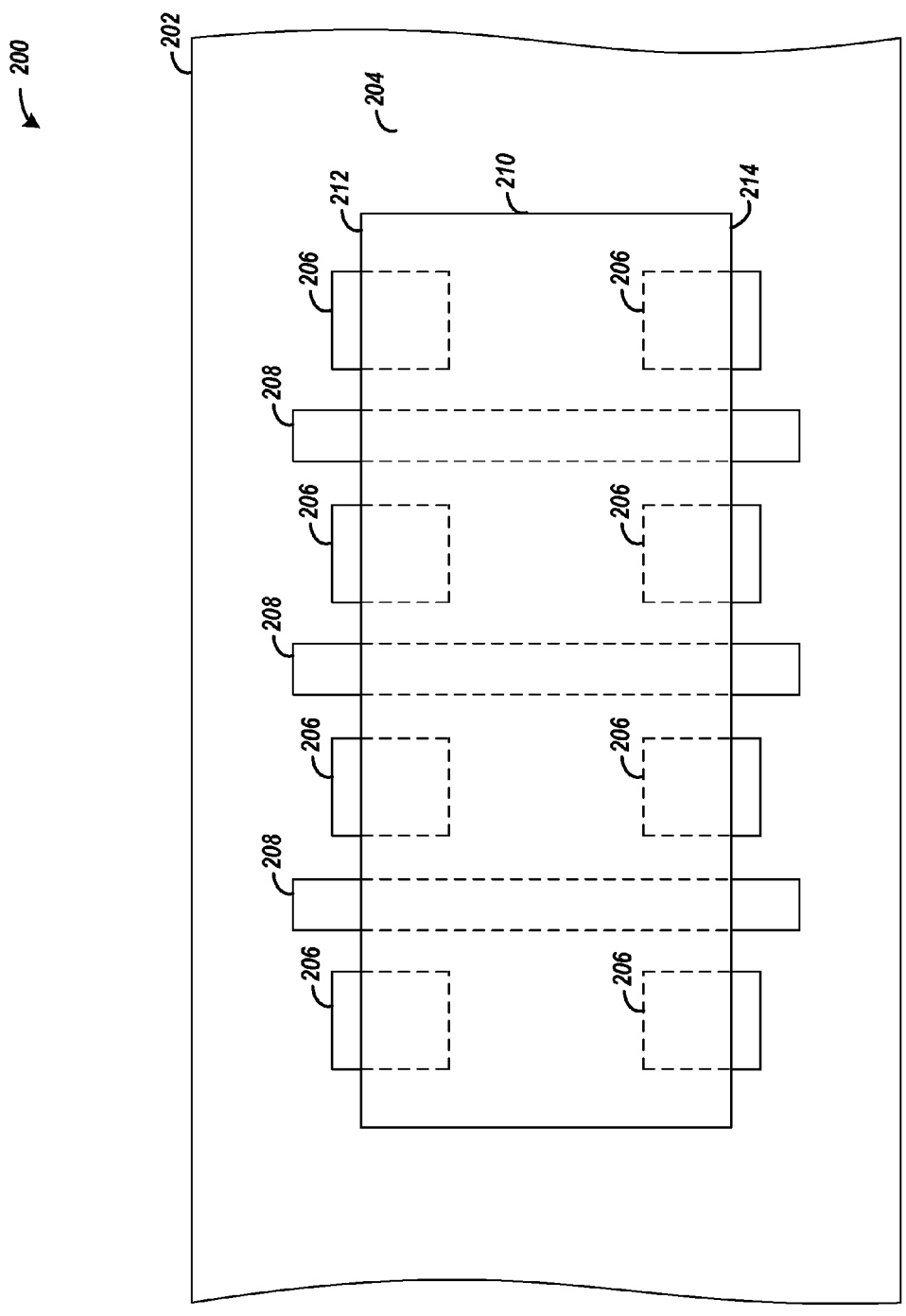
FIG. 2 shows a top view of a portion of an electronic assembly, according to an example embodiment of the invention.

FIG. 2 is a top view of a portion of an electronic assembly 200, according to an example embodiment of the present invention. The electronic assembly 200 includes a substrate 202 having a solder mask layer 204 that covers the surface of the substrate 202. Bond pads 206 are located on the surface of the substrate 202. Trenches 208 are formed in the solder mask layer 204. The trenches 208 are located between adjacent ones of the bond pads 206. The electronic assembly 200 also includes a component 210 that is mounted on the substrate 202 over the bond pads 206 and the trenches 208. In another embodiment, each of the pairs of bond pads 206, a pair being one bond pad near edge 212 of the component and the other bond pad near edge 214 of the component, is replaced with a single bond pad that extends approximately from edge 212 to edge 214.

In the illustrated embodiment, the trenches 208 extend at least from one edge 212 of the component 210 to another edge 214 of the component. In the embodiment illustrated in FIG. 2, the trenches 208 extend past the edges of the component 210. The trenches 208 are used to dispense underfill material (not shown in FIG. 2) underneath the component 210 to fill the gap between the component and the solder mask layer 204.

In one variation (not shown) of the embodiment shown in FIG. 2, the trenches 208 need not completely extend from one edge 212 to the other edge 214 of the component 210. Rather, each of trenches 208 could be split into two trenches such that one trench extends from edge 212 to near the centerline (between edges 212 and 214) of the component, and the other trench extends from edge 214 to near the centerline.

Figure 3:
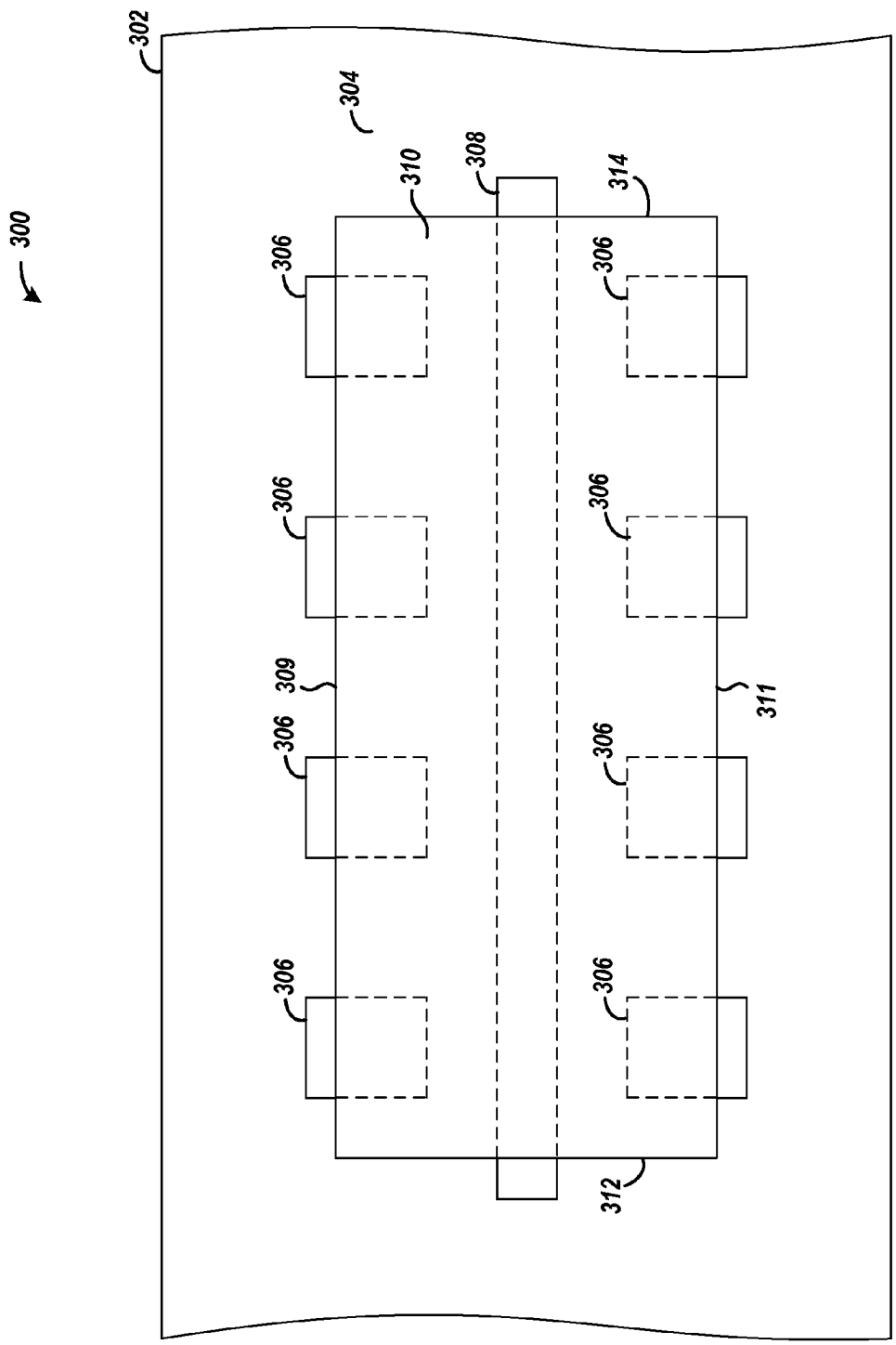
FIG. 3 shows a top view of a portion of an electronic assembly, according to another example embodiment of the present invention.

FIG. 3 is a top view of a portion of an electronic assembly 300, according to another example embodiment of the present invention. The electronic assembly 300 includes a substrate 302 having a solder mask layer 304 that covers the surface of the substrate 302. Bond pads 306 are located on the surface of the substrate 302. At least one trench 308 is formed in the solder mask layer 304. The trench 308 is located between the set of bond pads 306 located along edge 309 of the component 310 and the set of bond pads located along edge 311 of the component.

The trench 308 extends at least from one edge 312 of the component 310 to another edge 314 of the component 310. In the embodiment illustrated in FIG. 3, the trench 308 extends past the edges of the component 310 which allows dispensing of underfill material (not shown in FIG. 3) beneath the component 310 to fill the gap between the component and the solder mask layer 304.

In one variation (not shown) of the embodiment shown in FIG. 3, the trench 308 need not completely extend from one edge 312 to the other edge 314 of the component 310. Rather, trenches 308 could be split into two trenches such that one trench extends from edge 312 to near the centerline (between edges 312 and 314) of the component, and the other trench extends from edge 314 to near the centerline.

Figure 4:
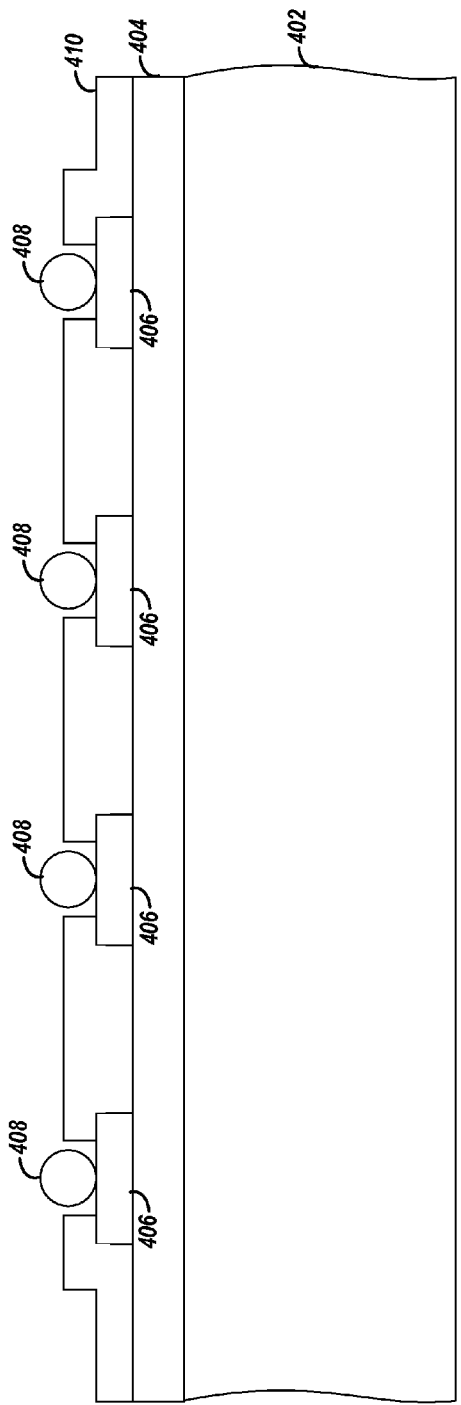
FIGS. 4-6 are cross sectional views of an electronic assembly at various stages of manufacture, according to a further example embodiment of the present invention.
Figure 5:
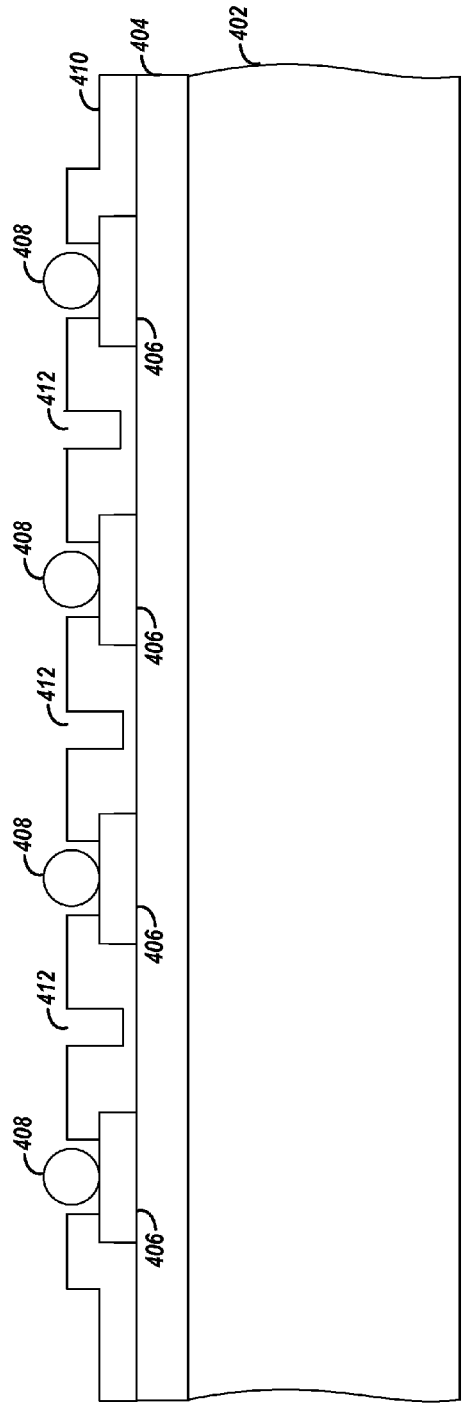
Figure 6:
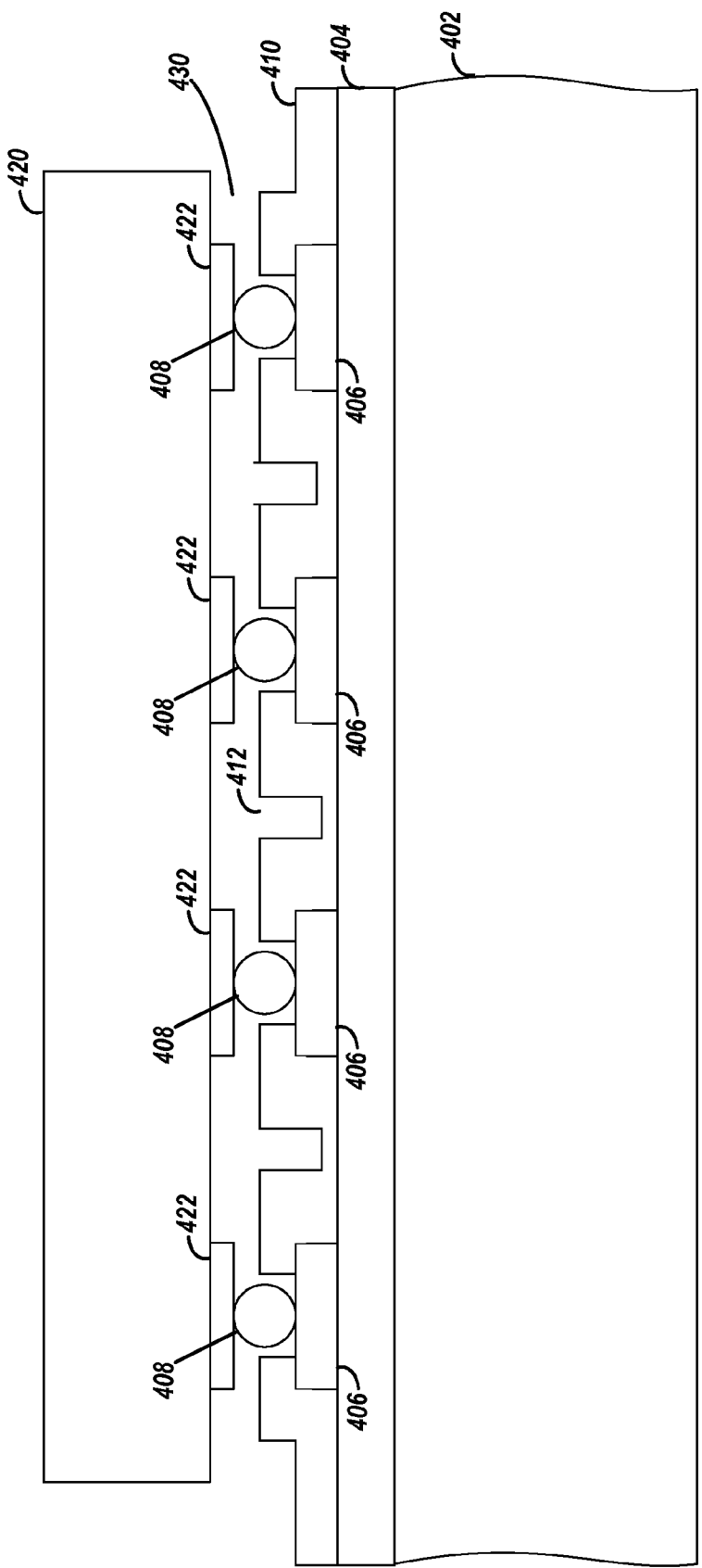

FIGS. 4-6 are cross sectional views of an electronic assembly at various stages of manufacture, according to an example embodiment of the present invention. Beginning with FIG. 4, a substrate 402 is provided. In one embodiment, the substrate 402 is a printed circuit board. A build-up layer 404 is formed on the surface of the substrate. Bond pads 406 are formed on the build-up layer 404. A solder connection 408 is formed on each of the bond pads 406. The solder connection can be formed from any suitable type of material including solder material such as PbSn, InSn and SbSn. Other alloys based on tin (Sn), gold (Ag), copper (Cu) and indium (In) metallurgy can also be used as solder material. A solder mask layer 410 is formed on top of the build-up layer 404. The solder mask layer 410 also covers a portion of the bond pads 406.

Turning now to FIG. 5, trenches 412 are formed in the solder mask layer 410. The trenches 412 are located between adjacent ones of the bond pads 406. In one embodiment, the trenches 412 have a depth of 20 μm and the trenches 412 do not extend through the solder mask layer 410 to the build-up layer 404. In an alternative embodiment, the trenches 412 extend through the solder mask layer 410 into the build-up layer 404. In this instance, the trenches 412 have a depth of about 50-60 μm. The trenches 412 can be formed by any of a variety of techniques such as by etching into the solder mask layer 410 using standard laser drill technology.

Turning now to FIG. 6, a component 420 is mounted on the substrate 402. The component 420 may be mounted using a thermal compression process. The component 420 has contacts 422 that are physically and electrically connected to the bond pads 406 via the solder connections 408. Underfill material (not shown in FIG. 6) is then dispensed to fill the space 430 between the component 420 and the solder mask layer 410. The underfill material is injected into the trenches 412 and the underfill material flows beneath the component 420 to fill the space 430. The underfill material can be based on a variety of types of materials including, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, or a fluxing underfill. The manufacturing process discussed in relation to FIGS. 4-6 results in the electronic assembly 100 of FIG. 1.

Figure 7:
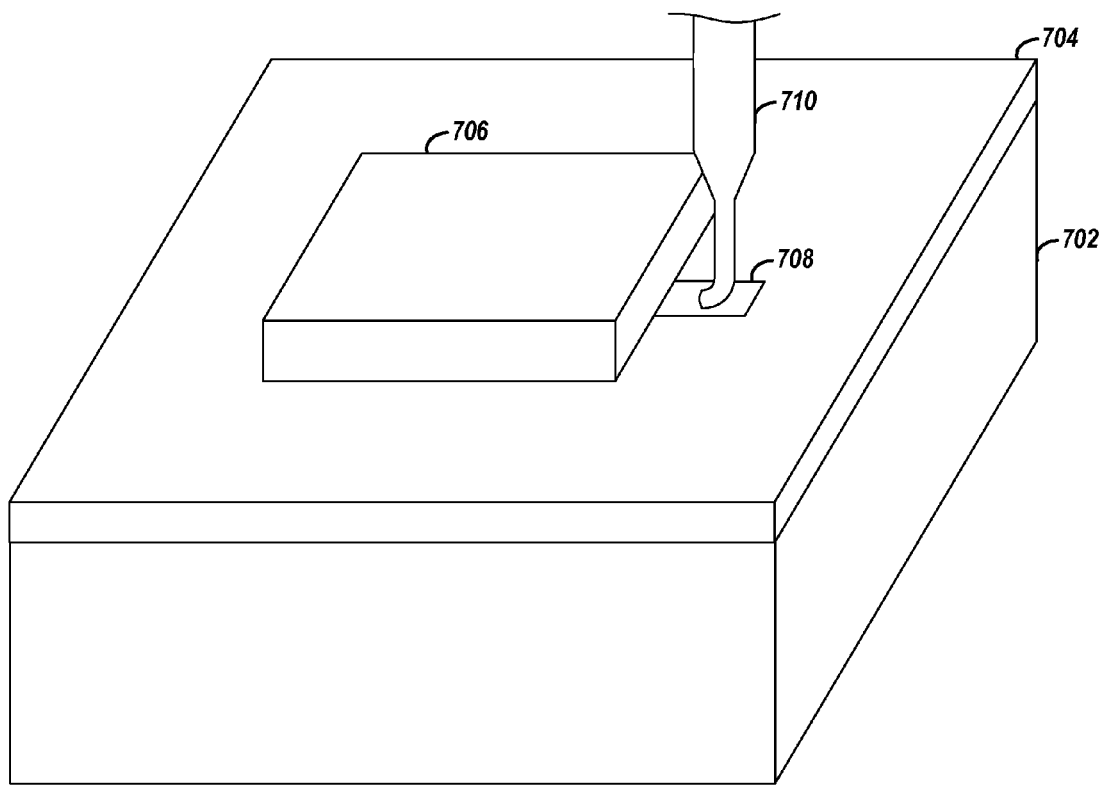
FIG. 7 shows a portion of an electronic assembly, according to an example embodiment of the present invention.

FIG. 7 is shows a portion of an electronic assembly, according to an example embodiment of the present invention. The electronic assembly includes a substrate 702 having a solder mask layer 704 covering the surface of the substrate 702. A component 706 is mounted on the substrate 702. The component 706 is physically and electrically connected to bond pads (not shown in FIG. 7) on the substrate 702 via solder connections. A trench 708 is formed in the solder mask layer 704 prior to mounting the component 706 on the substrate 702. The component 706 is mounted over the trench 708, which extends past an edge of the component 706. A dispensing needle 710 is used to dispense underfill material in the trench to fill the space between the component 706 and the solder mask layer 704.

As shown in FIG. 7, the dispensing needle 710 is positioned alongside the component 706 such that the outlet of the dispensing needle 710 is located above or within the trench 708. The dispensing needle 710 injects the underfill material into the trench 708 and the underfill material flows through the trench 708 beneath the component 706 to fill the space between the component 706 and the solder mask layer 704. The dispensing needle 710 is then moved to another component mounted on the substrate 702, or to another trench beneath the same component, and the process is repeated until underfill material has been dispensed underneath each component mounted on the substrate 702.

One or more embodiments of the present invention is thought to be applicable to a variety of electronic assemblies and integrated circuit packages. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An electronic assembly comprising:
    a substrate having a plurality of bond pads on a surface of the substrate;
    a solder mask covering the surface of the substrate;
    a solder connection on each of the plurality of bond pads;
    at least one trench formed in the solder mask, the at least one trench located between adjacent ones of the plurality of bond pads;
    at least one component having a plurality of contact pads, each contact pad connected to one of the plurality of bond pads via one of the solder connections, the at least one trench located beneath the component and extending at least from one edge of the component to a location underneath the component; and
    underfill material filling the at least one trench and space between the solder mask and the component.

2. The electronic assembly of claim 1, wherein the at least one trench comprises a plurality of trenches formed in the solder mask, each of the trenches located beneath the component and each of the trenches extends at least from one edge of the at least one component to another edge of the component.

3. The electronic assembly of claim 1, further comprising:
    wherein the at least one component includes a plurality of components mounted on the substrate, each of the components having contact pads that are connected to corresponding ones of the bond pads via corresponding ones of the solder connections;
    wherein the at least one trench includes a plurality of trenches formed in the solder mask, a set of one or more of the trenches located beneath a respective one of the components and each of the trenches in the set extending at least from an edge of the respective component to a location underneath the respective component; and
    underfill material filling each of the trenches and spaces between the solder mask and each of the components.

4. The electronic assembly of claim 1, wherein the component is a chip capacitor.

5. The electronic assembly of claim 1, wherein the underfill material is dispensed undercoat epoxy that completely fills the space between the solder mask and the component without the formation of micro-voids.

6. The electronic assembly of claim 1, wherein a depth of the at least one trench extends partially through the solder mask.

7. The electronic assembly of claim 1, further comprising a build-up layer located between the substrate and the solder mask, the at least one trench having a depth extending into the build-up layer.

8. The electronic assembly of claim 1, wherein the at least one trench has a depth sufficient to allow dispensed underfill material to flow underneath the component to fill the space between the solder mask and the component.

9. The electronic assembly of claim 1, wherein the at least one trench extends a distance past an edge of the component to enable dispensed underfill material to be injected into the trench and thereby flow underneath the component to fill the space between the solder mask and the component.

10. A method of manufacturing an electronic assembly, the method comprising:
    providing a substrate having a plurality of bond pads on a surface of the substrate, a solder mask covering the surface of the substrate, and a solder connection on each of the plurality of bond pads;
    forming at least one trench in the solder mask, the at least one trench located between adjacent ones of the plurality of bond pads,
    mounting at least one component on the substrate, the component having a plurality of contact pads, each connected to one of the plurality of bond pads via one of the solder connections, the component being located above the at least one trench and the at least one trench extending at least from one edge of the component to another edge of the component;
    using the at least one trench, dispensing underfill material to fill space between the solder mask and the component.

11. The method of claim 10, wherein the forming at least one trench includes forming a plurality of trenches in the solder mask prior to mounting the at least one component on the substrate, each of the trenches located beneath the component and each of the trenches extending at least from one edge of the component to another edge of the component after the component is mounted on the substrate.

12. The method of claim 10, further comprising:
    wherein the mounting at least one component includes mounting a plurality of components on the substrate, each of the components having contact pads that are connected to corresponding ones of the bond pads via the solder connections on the bond pads;
    wherein the forming at least one trench includes forming a plurality of trenches in the solder mask prior to mounting the components on the substrate, at least one of the trenches located beneath each of the components and each of the trenches extending at least from an edge of a respective one of the components to another edge of the respective one of the components; and after the components are mounted on the substrate using the at least one trench beneath each of the components, dispensing underfill material to fill space between the solder mask and each of the components.

13. The method of claim 12, wherein dispensing underfill material to fill space between the solder mask and each of the components includes using a dispensing needle to individually inject underfill material into the at least one of the trenches located beneath each of the components.

14. The method of claim 10, wherein forming at least one trench in the solder mask includes forming at least one trench having a depth sufficient to allow dispensed underfill material to flow underneath the component to fill the space between the solder mask and the component.

15. The method of claim 10, wherein forming at least one trench in the solder mask includes forming at least one trench that extends a distance past an edge of the component after the component is mounted on the substrate to enable dispensed underfill material to be injected into the trench and thereby flow underneath the component to fill the space between the solder mask and the component.

16. The method of claim 10, wherein the component is a chip capacitor.

17. The method of claim 10, wherein the underfill material is undercoat epoxy, and wherein dispensing underfill material to fill space between the solder mask and the component includes dispensing the undercoat epoxy to completely fill the space between the solder mask and the component without the formation of micro-voids.

18. An electronic assembly comprising:
a substrate having at least two bond pads on a first surface of the substrate;
a solder mask on the first surface of the substrate, wherein the solder mask has at least one trench formed therein and extending between the at least two bond pads;
a chip capacitor having at least two contact pads that are soldered to the at least two bond pads, respectively; and
underfill material filling the at least one trench and a void between the solder mask and the component.

19. The electronic assembly of claim 18, wherein a depth of the at least one trench extends partially through the solder mask.

20. The electronic assembly of claim 18, wherein the at least one trench extends a distance past an edge of the chip capacitor to enable dispensed underfill material to be injected into the trench and thereby flow underneath the chip capacitor to fill the space between the solder mask and the chip capacitor.

* * * * *